(12) United States Patent  
Saxler (10) Patent No.: US 7,646,024 B2  
(45) Date of Patent: Jan. 12, 2010

(54) STRUCTURE AND METHOD FOR REDUCING FORWARD VOLTAGE ACROSS A SILICON CARBIDE-GROUP III NITRIDE INTERFACE

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 215 days.

(21) Appl. No.: 11/465,470

(22) Filed: Aug. 18, 2006

(65) Prior Publication Data

US 2008/0042141 A1 Feb. 21, 2008

(51) Int. Cl.
*H01L 31/0256* (2006.01)
*H01L 31/0312* (2006.01)
*H01L 21/00* (2006.01)

(52) U.S. Cl. .................. 257/76; 257/77; 257/E33.028; 257/E33.033; 257/E33.034; 257/E33.037; 257/E33.04; 438/105; 438/931

(58) Field of Classification Search .................. 257/76, 257/77, E33.028, E33.33, E33.033, E33.034, 257/E33.037, E33.04; 438/105, 931
See application file for complete search history.

(56) References Cited

U.S. PATENT DOCUMENTS

| | | | |
|---|---|---|---|
| 5,393,993 A | 2/1995 | Edmond et al. | |
| 5,523,589 A | 6/1996 | Edmond et al. | |
| 5,532,489 A | 7/1996 | Yamashita et al. | |
| 5,661,074 A | 8/1997 | Tischler | |
| 5,874,747 A * | 2/1999 | Redwing et al. | 257/77 |
| 6,120,600 A * | 9/2000 | Edmond et al. | 117/89 |
| 6,459,100 B1 | 10/2002 | Doverspike et al. | |
| 6,533,874 B1 | 3/2003 | Vaudo et al. | |
| 6,734,033 B2 | 5/2004 | Emerson et al. | |
| 6,841,001 B2 | 1/2005 | Saxler | |
| 6,946,682 B2 | 9/2005 | Slater, Jr. et al. | |
| 6,958,497 B2 | 10/2005 | Emerson et al. | |
| 2005/0029533 A1* | 2/2005 | Wu et al. | 257/99 |
| 2005/0056825 A1* | 3/2005 | Bertin et al. | 257/20 |
| 2005/0158892 A1* | 7/2005 | McClure et al. | 438/22 |
| 2005/0194584 A1 | 9/2005 | Slater et al. | |

OTHER PUBLICATIONS

U.S. Appl. No. 11/037,965 filed Jan. 18, 2005, entitled High Output Small Area Group III-Nitride LEDs.

* cited by examiner

*Primary Examiner*—Long K Tran
(74) *Attorney, Agent, or Firm*—Summa, Additon, & Ashe, P.A.

(57) ABSTRACT

A structure is disclosed that reduces the forward voltage across the interface between silicon carbide and Group III nitride layers. The structure includes a conductive silicon carbide substrate and a conductive layer of aluminum gallium nitride on the silicon carbide substrate. The aluminum gallium nitride layer has a mole fraction of aluminum that is sufficient to bring the conduction bands of the silicon carbide substrate and the aluminum gallium nitride into close proximity, but less than a mole fraction of aluminum that would render the aluminum gallium nitride layer resistive.

21 Claims, 6 Drawing Sheets

STRUCTURE AND METHOD FOR REDUCING FORWARD VOLTAGE ACROSS A SILICON CARBIDE-GROUP III NITRIDE INTERFACE

BACKGROUND

The present invention relates to semiconductor devices in which a conductive silicon carbide (SiC) substrate is used in conjunction with Group III nitride active layers. Relevant devices can include light emitting diodes (LEDs) and other devices. In operation, these devices are characterized (in one respect) by the flow of current from a silicon carbide substrate to one or more Group III nitride layers.

As used herein, the term "Group III nitride" refers to those binary, ternary and quaternary compounds formed from the Group III elements and nitrogen. Examples include gallium nitride (GaN), aluminum gallium nitride (AlGaN), and indium gallium aluminum nitride (InGaAlN). In the ternary and quaternary compounds, the atomic fraction of all of the Group III elements taken together is in one-to-one ratio with the nitrogen. Thus (for example), AlGaN is often expressed by the formula $Al_xGa_{1-x}N$, where $0<x<1$.

In such structures and devices, the Group III nitride is usually present as one or more epitaxial layers. Group III nitrides provide a wide bandgap and a direct transition between the valence band and the conduction band. The wide bandgap offers a number of electronic advantages such as the capability of emitting photons in the green, blue, violet and ultraviolet portions of the electromagnetic spectrum. The direct transition offers efficiency in such emissions because all of the energy is generated as light.

Silicon carbide offers several advantages as the substrate for such Group III nitride layers. In addition to silicon carbide's physical and electronic advantages (wide bandgap, radiation hardness, high thermal conductivity, stability at high temperatures), it also offers an acceptable crystal lattice match with the Group III nitrides, it can be conductively doped, and it can be grown in transparent crystals that have a high refractive index.

When, however, different semiconductor materials such as SiC and GaN are placed adjacent one another, the difference between the respective conduction band edges encourages the carriers in each adjacent layer to find an equilibrium of the lowest available potential energy. When Group III nitrides are placed adjacent silicon carbide, this creates a relatively large energy barrier for electrons flowing from the silicon carbide substrate towards and into the Group III nitride layer. The presence of this barrier increases the forward voltage of the device thus reducing its efficiency as compared to theoretical maximums and creating heat rather than light or other desired output characteristics.

Accordingly, a motivation exists to attempt to reduce the energy barrier to correspondingly reduce forward voltage and increase the efficiency of any device incorporating this type of structure.

Commonly assigned and co-pending U.S. Patent Application Publication No. 20050158892 (and related applications) discloses a method of improving the voltage characteristics of a Group III nitride-silicon carbide interface by implanting the SiC with dopants and then annealing the resulting structure. The higher doping concentration in the silicon carbide helps reduce the energy barrier and thus reduce the forward current.

Although this technique offers certain advantages, the implanting and annealing steps add complexity to the process and require additional manufacturing time and equipment. As in any manufacturing or other sequential process, if steps can be eliminated, the overall efficiency of the process usually can be increased.

Furthermore, when implanting silicon carbide with a relatively high carrier concentration in order to lower the energy barrier, the higher doping can result in greater damage to the silicon carbide crystal. This can in turn cause undesired optical absorption in LED structures, can degrade the electronic properties of the SiC, and can create surface defects that can affect the quality of later epitaxial growth.

SUMMARY

In one aspect the invention is a structure that reduces the forward voltage across the interface between silicon carbide and Group III nitride layers. In this aspect, the invention comprises a conductive substrate, often silicon carbide, and a conductive layer of aluminum gallium nitride or aluminum indium gallium nitride on the conductive substrate. The aluminum gallium nitride layer has a mole fraction of aluminum that is sufficient to bring the conduction bands of the conductive substrate and the aluminum gallium nitride into close proximity, but less than a mole fraction of aluminum that would render the aluminum gallium nitride layer resistive.

In another aspect, the invention is a method of reducing the forward voltage across a semiconductor interface between a Group III nitride layer and an adjacent conductive layer. The method comprises increasing the mole fraction of aluminum in an aluminum gallium nitride layer having the formula $Al_xGa_{1-x}N$ where x is between 0.3 and 0.5 until the difference between the conduction band of the conductive layer and the conduction band of the aluminum gallium nitride is less than 0.05 electron volts (eV).

In another aspect, the invention is a structure that reduces the forward voltage across the interface between silicon carbide and Group III nitride layers. The structure comprises a conductive silicon carbide substrate doped no more than about 3E17 (3×1017 cm-3), and a conductive layer of aluminum gallium nitride on the silicon carbide substrate, the aluminum gallium nitride layer having a mole fraction of aluminum that positions the conduction band of the AlGaN within 0.05 eV of the conduction band of the SiC. In particular, the 3E17 concentration is helpful for minimal optical absorption in light emitting structures. For electronic devices other than optoelectronic ones, the doping can be increased somewhat, for example to between about 1E18 and 1E19 provided that introduction of defects from the additional doping is minimized or avoided.

In yet another aspect, the invention is a light emitting diode with reduced forward voltage across the interface between silicon carbide and Group III nitride layers. The light emitting diode comprises a conductive silicon carbide substrate and a conductive layer of aluminum gallium nitride on the silicon carbide substrate. The aluminum gallium nitride layer has a mole fraction of aluminum that is sufficient to bring the conduction bands of the silicon carbide substrate and the aluminum gallium nitride layer into close proximity, but less than a mole fraction of aluminum that would render the aluminum gallium nitride layer resistive. A Group III nitride active region is on the conductive aluminum gallium nitride layer, and ohmic contacts are on, or in electrical contact with, the silicon carbide substrate and the Group III nitride active region.

The foregoing and other objects and advantages of the invention and the manner in which the same are accomplished will become clearer based on the followed detailed description taken in conjunction with the accompanying drawings.

DETAILED DESCRIPTION

Figure 1:
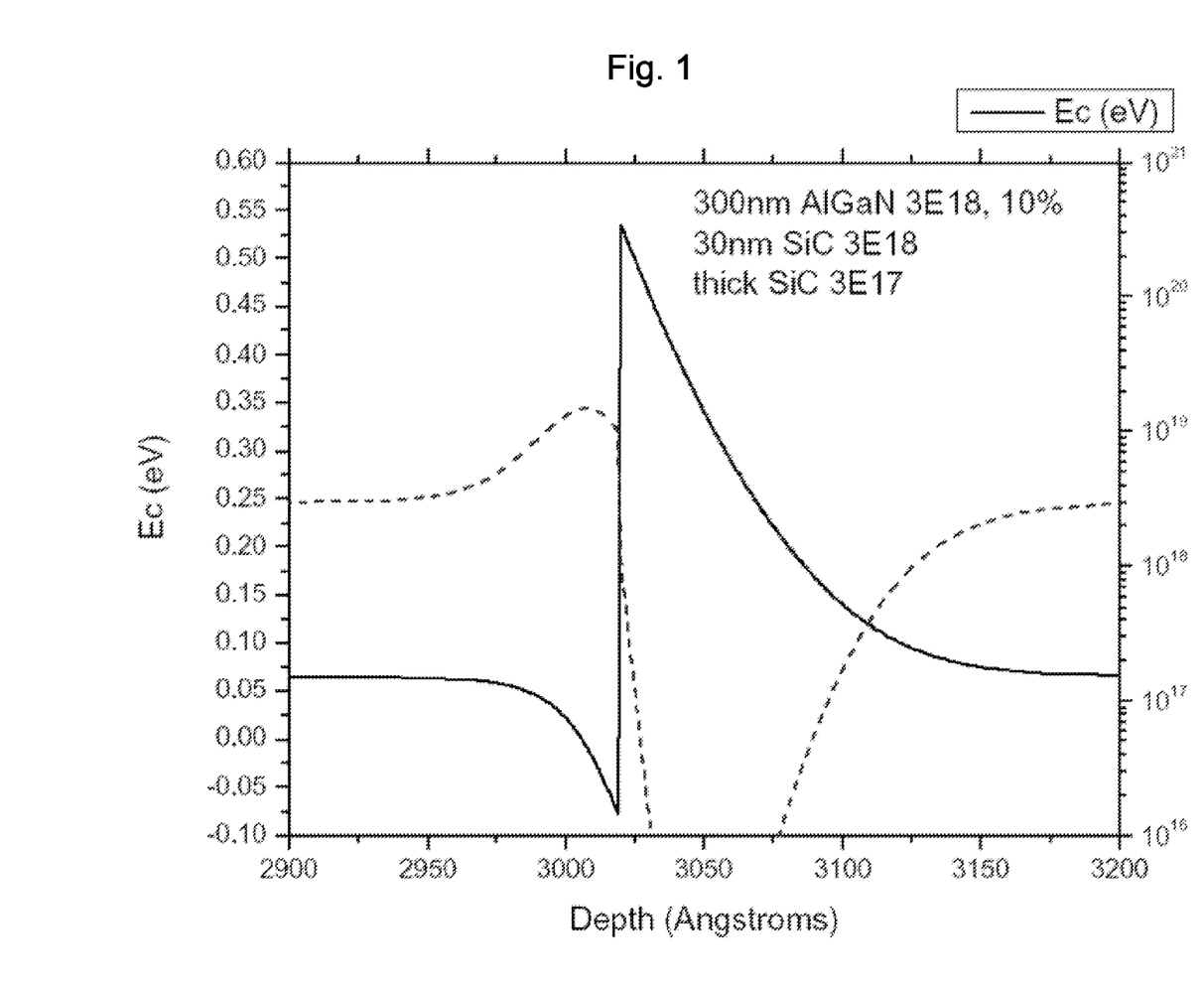
FIGS. 1-3 are conduction band diagrams for certain relationships between silicon carbide and Group III nitride layers.

A number of aspects of the invention are best illustrated and explained in conjunction with band edge diagrams. Accordingly, FIG. 1 is an energy band diagram across the interface of one example of a conductive substrate, in this case silicon carbide, and an adjacent layer of aluminum gallium nitride (AlGaN). The AlGaN layer was 300 nanometers (nm) thick, had an atomic fraction of aluminum of 10 percent ($Al_{0.1}Ga_{0.9}N$), and was doped at 3E18 ($3 \times 10^{18}$ $cm^{-3}$). This AlGaN layer was on a 30 nm thick portion of silicon carbide doped at 3E18 which in turn was carried by a thicker portion of SiC doped at 3E17.

In FIG. 1, the conduction band edge is indicated by the solid line, and the carrier concentration is illustrated by the dashed line. In the orientation of FIG. 1, the depth (i.e., the abscissa in FIGS. 1-5) is measured from the surface of the AlGaN layer. Thus the depths from 2900 to about 3020 Angstroms (Å) represent the AlGaN and the depths from about 3020 to 3200 Å represent the silicon carbide. The resulting band offset produces a relatively high (about 0.5 eV) and wide (about 100 Å) energy barrier across the SiC—AlGaN interface. In order for forward current to flow, electrons must either overcome or tunnel through this barrier.

As will be understood by those familiar with this art, the band edge representations in the figures are generated from models and simulations, including relevant assumptions. Thus, they are not intended to represent exact properties. The information provided by the shapes and illustrated trends are, however, representative of the invention and of the desired results.

It will also be understood that the aluminum composition calibration (i.e., the measured value of "x") can differ somewhat depending upon the amount of strain in a particular crystal layer as well as the measurement technique and instrumentation.

Additionally, the relationship between band edges is different for different polytypes with for example, a lower aluminum percentage being preferred for 6H silicon carbide in comparison to 4H silicon carbide.

This combination of factors generally requires the user to grow a plurality of aluminum gallium nitride layers to obtain the proper composition in accordance with the invention. This is, however, expected and recognized in the art of growing aluminum gallium nitride and represents a predictable, rather than undue, degree of experimentation.

Figure 2:
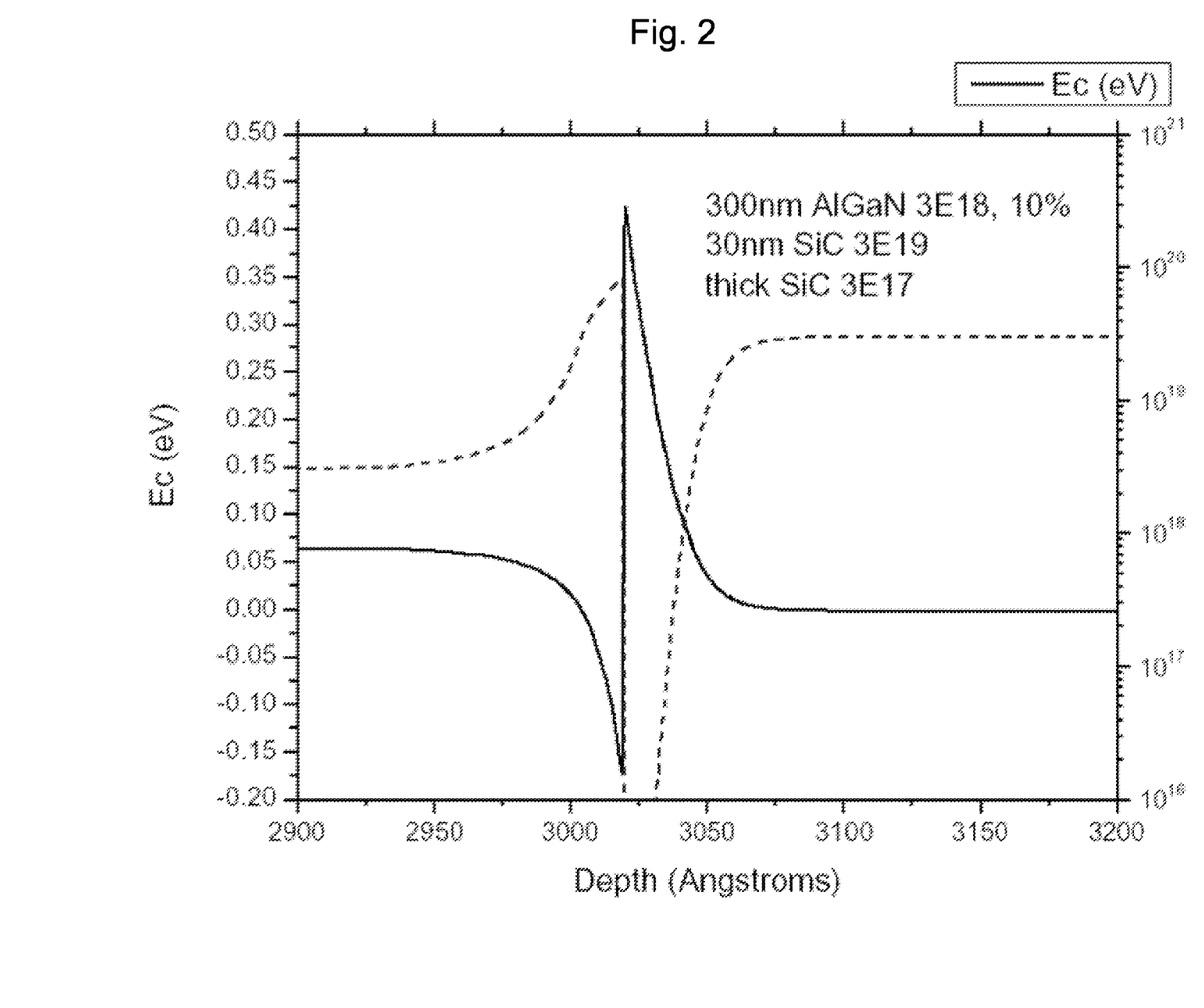

FIG. 2 illustrates the effect of increasing the doping concentration in the silicon carbide; e.g. as in previously-referenced publication No 20050158892. The structure for which FIG. 2 diagrams the properties is identical to the structure represented by FIG. 1 with the exception that in FIG. 2, the 30 nm portion of silicon carbide is doped 3E19 rather than 3E18; i.e., an order of magnitude higher. As FIG. 2 illustrates, this minimally decreases the height of the barrier (to about 0.4 eV), but narrows the barrier markedly (to about 30 Å), and thus increases the likelihood of tunneling. Accordingly, as set forth in the Background, all other factors being equal, the increased doping of the silicon carbide offers an improvement in reducing the forward voltage characteristics of the structure.

Figure 3:
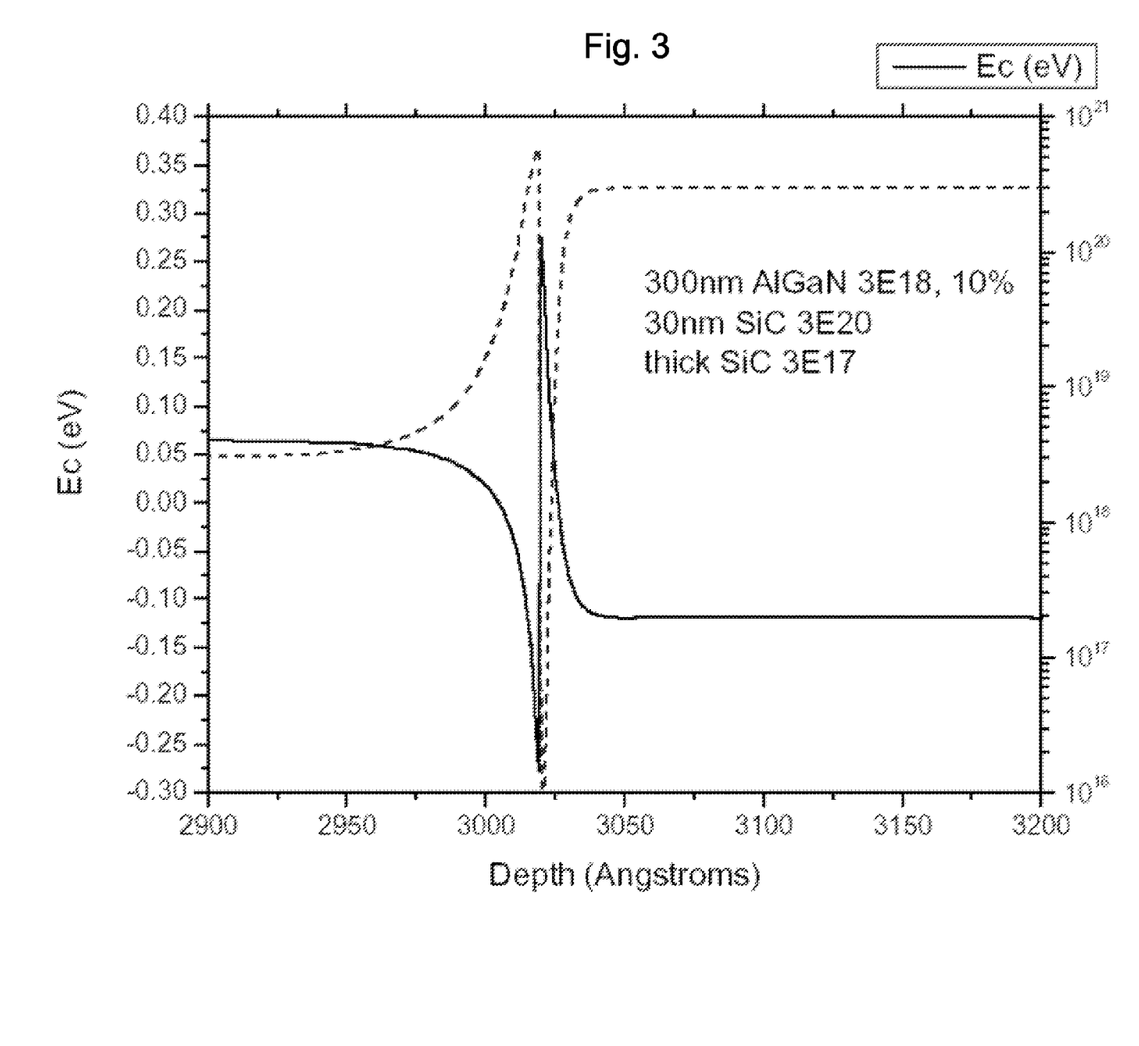

FIG. 3 represents yet another order of magnitude increase over the structure of FIG. 2, and an increase of two orders of magnitude over the properties illustrated in FIG. 1. In FIG. 3, the 30 nm thick silicon carbide portion is doped at 3E20 and considerably lowers (to about 0.3 eV) and narrows (to about 5-10 Å) the barrier and thus increases the probability of tunneling.

Nevertheless, as set forth in the Background, such high doping requires additional steps of implantation and annealing and increases the difficulty of maintaining high crystal quality and a good surface for later epitaxial growth.

Figure 4:
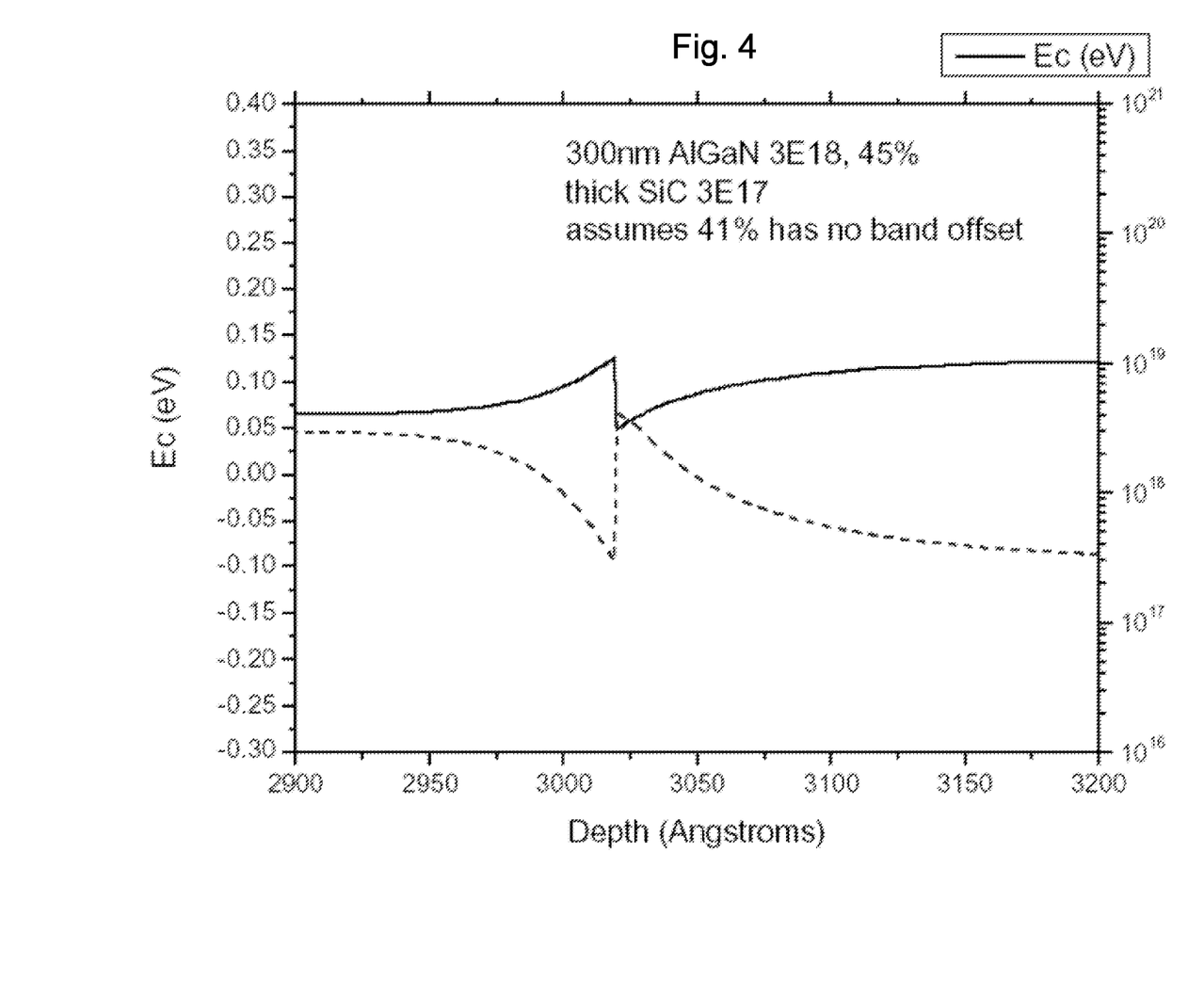
FIGS. 4 and 5 are conduction band diagrams for structures according to the present invention.

FIG. 4 illustrates the characteristics of a structure according to the present invention. In this structure, the silicon carbide has a more manageable concentration of 3E17, and the AlGaN has a mole fraction of aluminum of 0.45; i.e. Al0.45Ga0.55N. As FIG. 4 illustrates, this moves the band edges of the two materials into close proximity to one another, thus minimizing the energy barrier and reducing the forward voltage. In the embodiment illustrated in FIG. 4, the band edges are within about 0.075 eV at the interface and within about 0.02 eV at about 100 Å from the interface.

Figure 5:
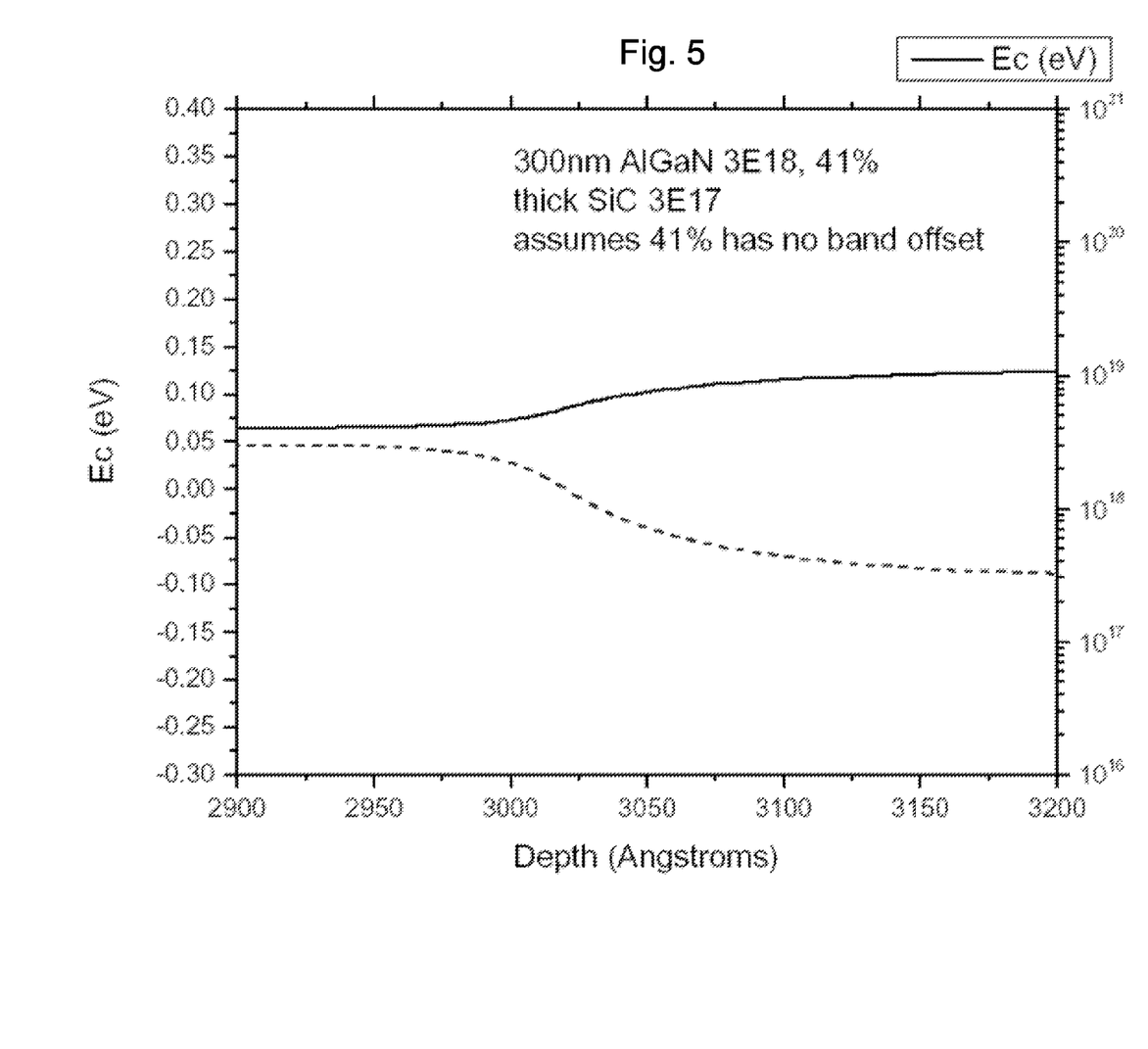

FIG. 5 illustrates the theoretically ideal case in which the AlGaN has a mole fraction of aluminum of 0.41, which eliminates the band offset entirely. Obtaining exactly this amount is difficult from a practical standpoint, however, and thus structures that approach this ideal are, for practical purposes, as good as those that meet the ideal.

It will be understood also, however, that in addition to offering independent advantages, the invention can be incorporated in conjunction with the increased doping techniques referred to in the Background (e.g., U.S. Patent Application Publication No. 20050158892).

Figure 6:
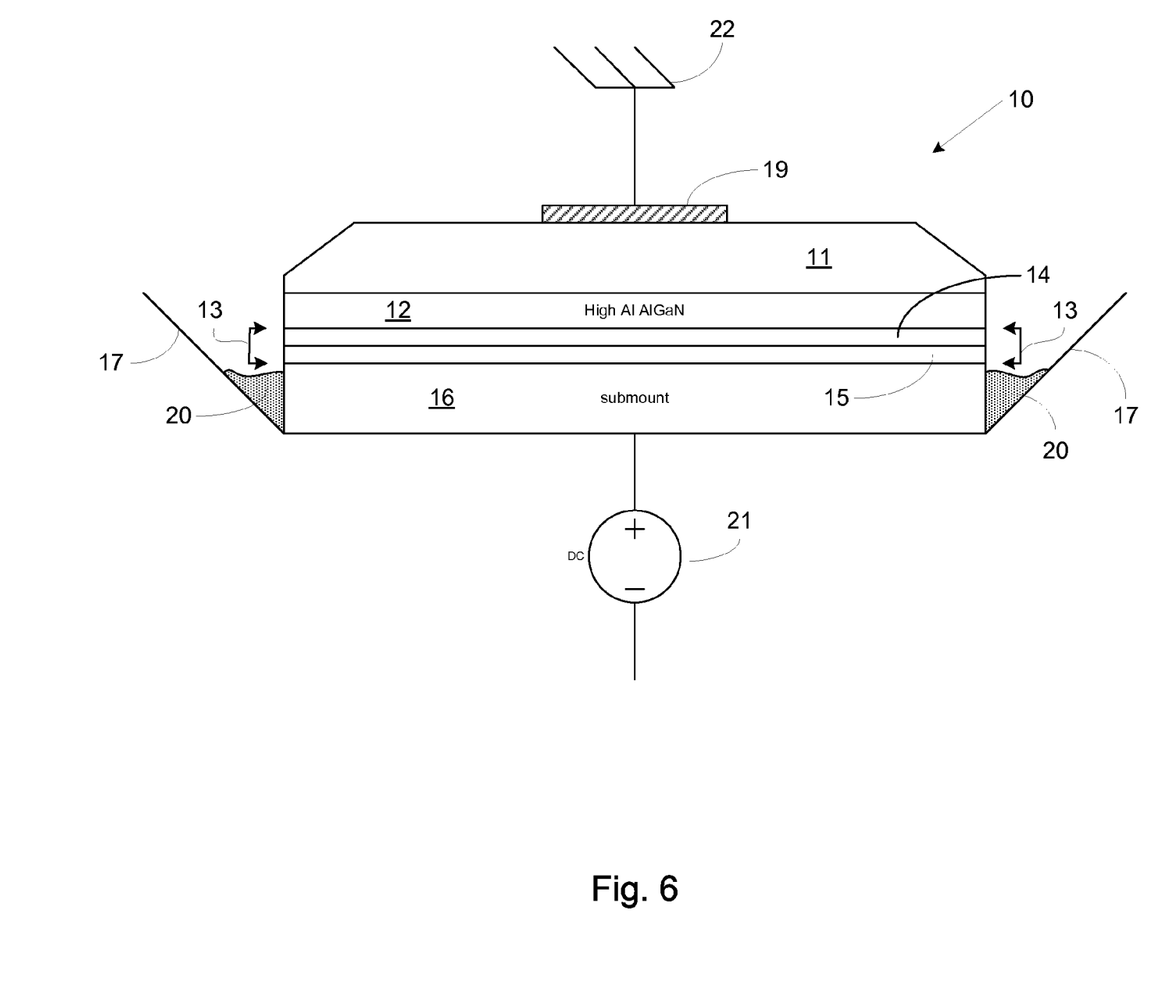
FIG. 6 is a schematic diagram of a light emitting diode that incorporates aspects of the present invention.

FIG. 6 illustrates aspects of the invention in the context of a schematic view of a light emitting diode in a flip chip orientation. The diode is broadly designated at 10 and includes a conductive silicon carbide substrate 11 and a conductive layer 12 of aluminum gallium nitride on the substrate 11. The substrate 11 and the aluminum gallium nitride layer 12 together form a structure that reduces the forward voltage across the interface between the silicon carbide substrate 11 and other Group III nitride layers in a device. As set forth with respect to the band edge diagrams, the aluminum gallium nitride layer 12 has a mole fraction of aluminum that is sufficient to bring the conduction bands of the silicon carbide substrate 11 and the aluminum gallium nitride layer 12 into close proximity, but less than a mole fraction of aluminum that would render the aluminum gallium nitride layer resistive.

The higher mole fraction of aluminum avoids the necessity of significantly increasing the doping of the silicon carbide so that the substrate 11 can be doped as desired for other purposes and can be as low as (or lower than) 3E17 if desired or necessary. The conductive aluminum gallium nitride layer 12 is typically doped with silicon and is considered conductive (which is, of course, a relative term) if it has a resistivity below about 1500 ohm centimeters ($\Omega$-cm) at room temperature and preferably a resistivity below about 1 $\Omega$-cm at room temperature.

In exemplary embodiments, the silicon carbide substrate 11 is a single crystal and has a polytype selected from the 3C, 4H, 6H, and 15R polytypes of silicon carbide.

As further set forth with respect to FIGS. 1 through 5, the mole fraction of aluminum that brings the band edges into proximity is typically greater than 0.3 (sometimes expressed as 30 percent) and in exemplary embodiments greater than 0.4 (40%). An aluminum mole fraction greater than about 0.5 is, however, generally avoided because at such an aluminum concentration, any oxygen atoms in the lattice (even in small amounts that would otherwise be negligible) begin to function as deep levels that tend to counteract (undesirably compensate) the n-type doping.

In the context of the light emitting diode illustrated in FIG. 6, the invention further includes a Group III nitride active region designated by the brackets 13 on the conductive AlGaN layer. As is well understood by those of skill in this art, light emitting diodes can contain additional layers such as buffers or contact layers (particularly p-contact layers for Group III nitrides). Thus, layers described as being "on" one another can also include layers that are above one another, even if not in direct contact. Generally, the usages and relationships are clear in context. FIG. 6 schematically illustrates two layers, an n-type layer 14, and a p-type layer 15 that form a p-n junction that generates the desired photons under an applied forward current.

The specific operation of light emitting diodes in general is well understood in this art (e.g., Sze, Physics of Semiconductor Devices, Second Edition (1981) John Wiley & Sons, Inc. and Sze, Modern Semiconductor Device Physics (1998) John Wiley & Sons, Inc. being exemplary sources.) and the particular operation of and structure of Group III nitride emitting layers on silicon carbide substrates is set forth in a number of commonly assigned U.S. patents and U.S. published applications including, but not limited to Nos. 20050194584; U.S. Pat. Nos. 6,958,497; 6,946,682; 6,734,033; 6,533,874; 6,459,100; 6,120,600; and 5,661,074.

In many embodiments, the n-type layer of Group III nitride will include or comprise indium gallium nitride (InGaN) because within the visible spectrum, the amount (mole fraction) of indium can be used to tune the emission of the diode to particular desired wavelengths. It will be understood, however, that the active region 13 can comprise a larger plurality of layers including single quantum wells, multiple quantum wells, and superlattice structures. These are likewise well understood in the art and will not be described in detail herein.

In the flip chip orientation that is useful for light emitting diodes for a number of purposes, the diode further typically includes a sub-mounting structure 16 that is opposite the Group III nitride active region 13 from the silicon carbide substrate 11 for mounting the diode 10 on the lead frame 17 in the flip chip orientation. FIG. 6 illustrates that the diode is often fixed in place with a conductive solder 20. In this context, the sub-mounting structure 16 provides physical spacing between the lead frame 17, the conductive solder 20 and the junction formed by the active region 13 (layers 14 and 15). It will be further understood that the illustration of FIG. 6 is simplified with respect to the sub-mounting structure 16 and its relationship to the active region 13. The invention is clear within this simplified context of these elements, and a more detailed description of the structure of the sub-mounting structure 16 and its relationship the remainder of the device 10 can be taken from copending and commonly assigned patents and applications such as Ser. No. 11/037,965; filed Jan. 18, 2005 for, "High Output Small Area Group III-Nitride LEDs," the contents of which is incorporated entirely herein by reference. From a current commercial standpoint, the XB™ chips available from Cree, Inc., Durham, N.C., USA (the present assignee) are exemplary of the general design of flip chip diodes using Group III nitrides on silicon carbide substrates.

FIG. 6 also schematically illustrates an ohmic contact 19, a source of direct current 21, and a chassis 22 into which the diode 10 is incorporated. The diode 10 can be further incorporated into an LED lamp which typically includes a mounting structure and a lens (not shown) in a manner well understood in this art.

Because the basic structure of the silicon carbide substrate 11 and the high aluminum content aluminum gallium nitride layer 12 are useful in context with additional layers, in exemplary embodiments the conductive layer 12 of aluminum gallium nitride can be compositionally graded within the expressed parameters with a higher mole fraction of aluminum at the AlGaN/SiC interface and a lower mole fraction of aluminum opposite the AlGaN/SiC interface. In the context of FIG. 6, when the composition is graded in this manner, the lower mole fraction of aluminum is in contact with the active region 13. The grading should, however, be sufficiently moderate to avoid spontaneous or piezo grade-induced doping. Similarly, the grading should maintain (or avoid changing) any desired strain state in the epitaxial layers in order to avoid cracking or excessive wafer bow.

The invention can also be expressed in terms of the relationship of the conduction band edges. In this aspect the invention comprises a conductive silicon carbide substrate 11 doped no more than about 3E17 and a conductive layer 12 of aluminum gallium nitride on the silicon carbide substrate 11. The aluminum gallium nitride layer 12 has a mole fraction of aluminum that positions the conduction band of the aluminum gallium nitride layer within 0.075 electron volts (eV) of the conduction band of the silicon carbide at the interface between the materials, with the edge of the AlGaN band usually being slightly higher than the edge of the SiC conduction band. More preferably, the mole fraction of aluminum is sufficient to position the conduction band of the aluminum gallium nitride within 0.02 eV of the conduction band of the silicon carbide and most preferably within about 0.01 eV of the conduction band of the silicon carbide at the interface. As set forth with respect to FIGS. 4 and 5, the preferred amount of aluminum is between about 0.41 and 0.45.

In yet another aspect, the invention is a method of reducing the forward voltage across a semiconductor interface between a Group III nitride layer and an adjacent conductive layer, particularly a silicon carbide layer. In this aspect the invention comprises increasing the mole fraction of aluminum in aluminum gallium nitride having the formula $Al_xGa_{1-x}N$ where x is between about 0.3 and 0.5 until the difference between the conduction band of the silicon carbide and the conduction band of the aluminum gallium nitride is less than 0.075 eV at the interface. As expressed previously, reducing the difference between the conduction bands to less than 0.02 eV or less than 0.01 eV at the interface is even more preferred.

The method can further comprise applying a forward voltage from the silicon carbide layer to the aluminum gallium nitride layer, applying the forward voltage to a Group III nitride active region on the aluminum gallium nitride layer, and applying the forward voltage across a p-n junction.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A structure that reduces the forward voltage across the interface between a conductive substrate and Group III nitride layers, said structure comprising:
    a conductive substrate; and
    a conductive layer selected from the group consisting of aluminum gallium nitride and aluminum indium gallium nitride on said substrate;

said conductive nitride layer having a mole fraction of aluminum that is greater than about 30%, and that is sufficient to bring the conduction bands of said substrate and said conductive nitride layer to within about 0.075 eV of one another, and that is less than a mole fraction of aluminum at which said nitride layer is resistive.

2. A structure according to claim 1 wherein said silicon carbide substrate is doped no more than about 5E18.

3. A structure according to claim 1 wherein said silicon carbide substrate is doped no more than about 3E17.

4. A structure according to claim 1 wherein said conductive layer comprises aluminum gallium nitride that is compositionally graded with a higher mole fraction of aluminum at the AlGaN/SiC interface and a lower mole fraction of aluminum opposite said AlGaN/SiC interface.

5. A structure according to claim 1 wherein said conductive layer comprises aluminum gallium nitride doped with silicon.

6. A structure according to claim 1 wherein said conductive layer of aluminum gallium nitride has a resistivity below about 1500 ohm cm at room temperature.

7. A structure according to claim 1 wherein said conductive nitride layer has a resistivity below about 1 ohm cm at room temperature.

8. A structure according to claim 1 wherein said silicon carbide substrate is a single crystal and has a polytype selected from the 3C, 4H, 6H and 15R polytypes of silicon carbide.

9. A structure according to claim 1 wherein said conductive layer comprises aluminum gallium nitride with a mole fraction of aluminum greater than 40% (0.4).

10. A light emitting diode that incorporates the structure of claim 1.

11. A light emitting diode according to claim 1 that includes an active portion with at least one Group III nitride layer.

12. A structure according to claim 1 wherein said aluminum gallium nitride layer has a mole fraction of aluminum that positions the conduction band of the AlGaN within 0.02 eV of the conduction band of the silicon carbide at the interface of the silicon carbide with the aluminum gallium nitride.

13. A structure according to claim 1 wherein said aluminum gallium nitride layer has a mole fraction of aluminum that positions the conduction band of the AlGaN within 0.01 eV of the conduction band of the silicon carbide at the interface of the silicon carbide with the aluminum gallium nitride.

14. A structure according to claim 1 wherein said aluminum gallium nitride layer has a mole fraction of aluminum of between about 41 and 45% (0.41 and 0.45).

15. A light emitting diode with reduced forward voltage across the interface between silicon carbide and Group III nitride layers, said light emitting diode comprising:
 a conductive silicon carbide substrate;
 a conductive layer of aluminum gallium nitride on said silicon carbide substrate;
 said aluminum gallium nitride layer having a mole fraction of aluminum that is greater than about 30%, and that is sufficient to bring the conduction bands of said substrate and said conductive nitride layer to within about 0.075 eV of one another, and that is less than a mole fraction of aluminum at which said nitride layer is resistive;
 a Group III nitride active region on said conductive aluminum gallium nitride layer; and
 ohmic contacts to said silicon carbide substrate and to said Group III nitride active region.

16. A light emitting diode according to claim 15 wherein said Group III nitride active region includes at least p-type and n-type layers of Group III nitride.

17. A light emitting diode according to claim 16 wherein said n-type layer of Group III nitride comprises indium gallium nitride.

18. A light emitting diode according to claim 15 further comprising a sub-mounting structure opposite said Group III nitride active region from said silicon carbide substrate for mounting said diode on a lead frame in a flip chip orientation.

19. A light emitting diode according to claim 18 further comprising a lead frame in electrical contact with said sub-mounting structure.

20. A lamp that incorporates the light emitting diode according to claim 19.

21. An LED lamp according to claim 20 further comprising a header structure and a lens.

\* \* \* \* \*